US012772899B2

(12) United States Patent
Molzer et al.

(10) Patent No.: US 12,772,899 B2
(45) Date of Patent: Oct. 20, 2026

(54) BACK SIDE POWER SUPPLY FOR ELECTRONIC DEVICES

(71) Applicant: Intel Corporation, Santa Clara, CA (US)

(72) Inventors: Wolfgang Molzer, Ottobrunn (DE); Klaus Herold, Munich (DE); Joachim Singer, Neubiberg (DE); Peter Baumgartner, Munich (DE); Michael Langenbuch, Munich (DE); Thomas Wagner, Regelsbach (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 17/448,732

(22) Filed: Sep. 24, 2021

(65) Prior Publication Data

US 2023/0094594 A1 Mar. 30, 2023

(51) Int. Cl.
*H10W 90/00* (2026.01)
*H10D 84/83* (2025.01)
(Continued)

(52) U.S. Cl.
CPC ............ *H10W 90/00* (2026.01); *H10D 84/83* (2025.01); *H10W 40/22* (2026.01); *H10W 70/685* (2026.01); *H10W 90/297* (2026.01)

(58) Field of Classification Search
CPC ............... H01L 25/0657; H01L 23/367; H01L 23/49822; H01L 23/481; H01L 23/3675; H01L 23/5385; H01L 23/5389; H01L 23/49816; H01L 23/5286; H01L 2225/06541; H01L 2225/06548; H01L 2225/06586; H01L 2225/06513; H01L 2225/06517; H01L 2225/06589; H01L 24/08; H01L 24/16; H01L 2224/06181; H01L 2224/08145; H01L 2224/12105; H01L 2224/16227; H01L 2224/16235; H01L 2224/73251; H01L 2224/73253; H01L 2224/96; H01L 2924/1431; H01L 2924/1434; H01L 2924/15311; H01L 2924/19104; H01L 25/16; H01L 25/18; H01L 2225/1094; H01L 2023/4043; H01L 2225/06562; H10D 84/83; H10D 89/105;
(Continued)

(56) References Cited

U.S. PATENT DOCUMENTS

2005/0093120 A1* 5/2005 Millik .................. H05K 1/0262
257/E23.101
2012/0139103 A1 6/2012 New
(Continued)

*Primary Examiner* — Julio J Maldonado
*Assistant Examiner* — Nathan Pridemore
(74) *Attorney, Agent, or Firm* — SPL Patent Attorneys PartG mbB; Yong Beom Hwang

(57) ABSTRACT

A semiconductor device is disclosed, comprising a first semiconductor die comprising a plurality of transistors; a second semiconductor die comprising power supply circuitry configured to generate a supply voltage for the plurality of transistors of the first semiconductor die; and a heat spreader structure. A power supply routing for a reference voltage or a power supply voltage which extends from the heat spreader structure through the second semiconductor die to the first semiconductor die.

8 Claims, 9 Drawing Sheets

(51) Int. Cl.
*H10W 40/22* (2026.01)
*H10W 70/685* (2026.01)
*H10W 90/20* (2026.01)

(58) Field of Classification Search
CPC ............ H10W 20/427; H10W 90/288; H10W 40/233; H10W 90/24; H10W 90/00; H10W 90/297; H10W 90/291; H10W 90/722; H10W 90/724; H10W 90/792; H10W 90/401; H10W 90/701; H10W 90/736; H10W 90/766; H10W 40/22; H10W 40/20–242; H10W 70/685; H10W 70/611; H10W 70/614; H10W 70/461; H10W 72/0198; H10W 72/241; H10W 72/823; H10W 72/874; H10W 72/877; H10W 72/944; H10W 72/886; H10W 20/481
See application file for complete search history.

(56) References Cited

U.S. PATENT DOCUMENTS

| | | | | |
|---|---|---|---|---|
| 2014/0225248 | A1* | 8/2014 | Henderson .......... | H01L 23/5383 438/122 |
| 2018/0096735 | A1* | 4/2018 | Pappu .................... | G11C 5/025 |
| 2019/0333876 | A1* | 10/2019 | Yudanov ............... | H01L 23/645 |

* cited by examiner

BACK SIDE POWER SUPPLY FOR ELECTRONIC DEVICES

FIELD

Examples relate to powering semiconductor dies, devices, and circuits.

BACKGROUND

Semiconductor devices have numerous applications. Power and signal lines can be coupled to the transistors of semiconductor dies and may form part of a working device. Several challenges can arise when forming power and/or signal connections to the transistors.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
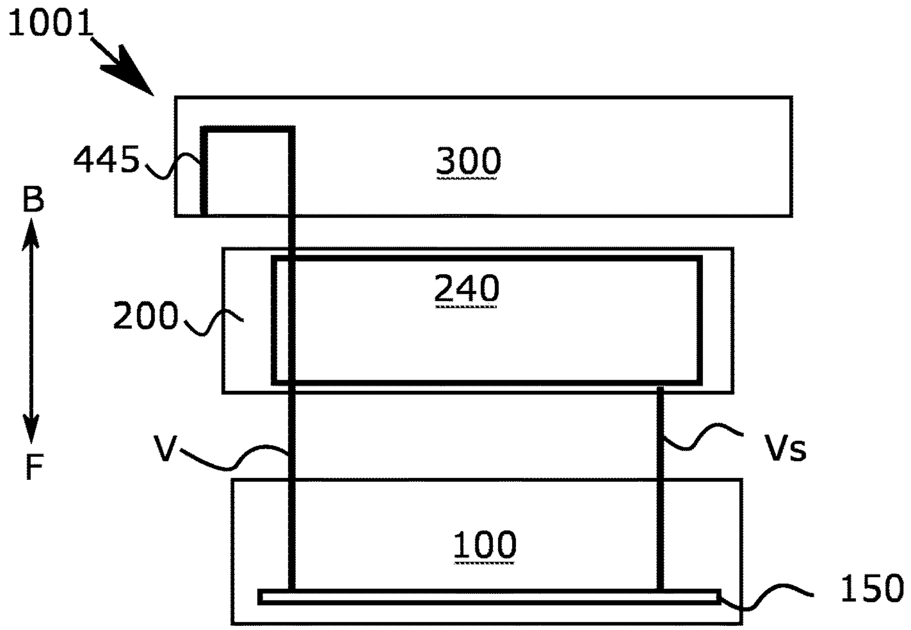
FIG. 1A illustrates a semiconductor device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Herein, a trailing "(s)" means one or more; for example "transistor(s)" can be one or more transistors.

Herein, a heat spreader structure can include a heat spreader. A heat spreader may be a structure which aids in conducting heat from a heat source such as for heat management of electronic dies, electronic devices, electronic packages, and the like. Herein, a heat conductive adhesive material (e.g. a thermal interface material) may be present between structures such as dies and/or modules, particularly at a face of the heat spreader structure and adjacent structures (adjacent structures such as voltage regulators, voltage regulator dies, and molds).

Figure 1B:
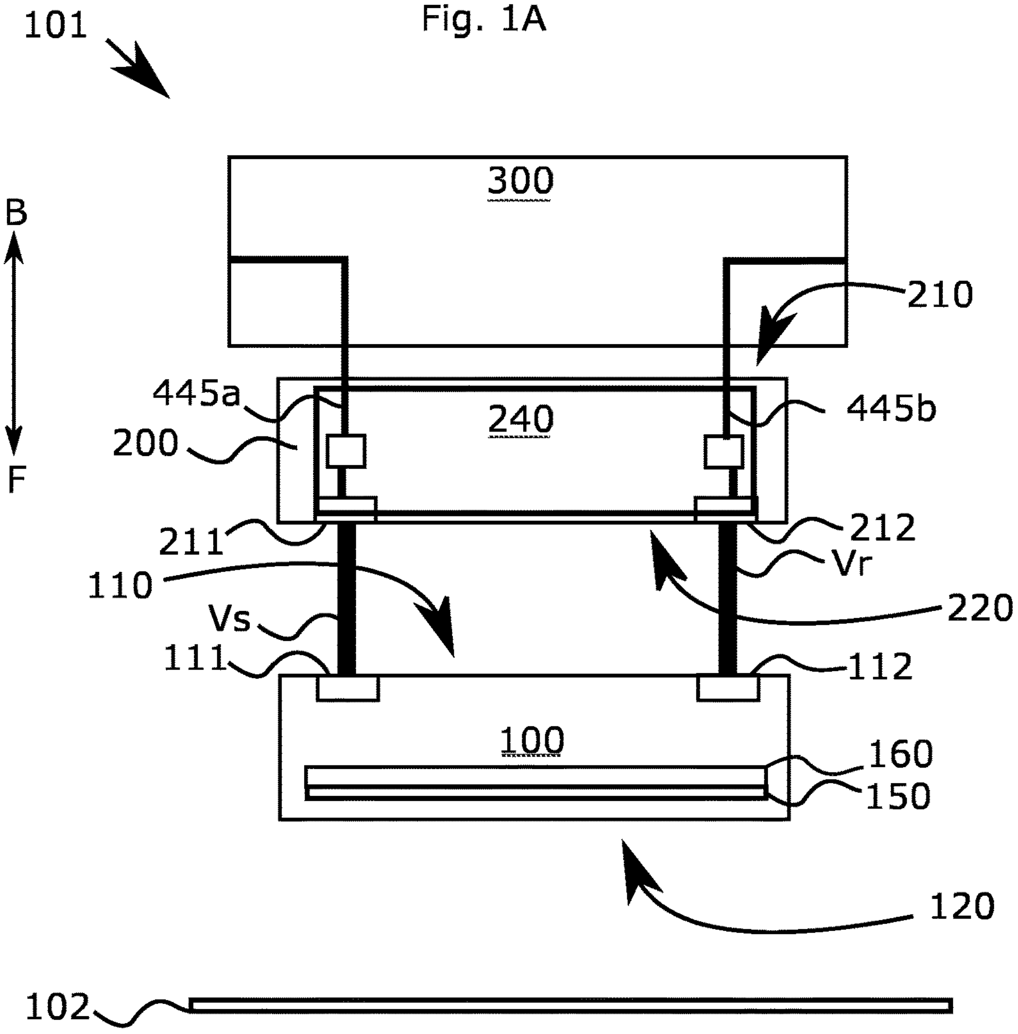
FIG. 1B illustrates a semiconductor device.

Herein the front side of a die or device is typically toward the bottom of the associated figures which show the die or device in cross section. For example, FIGS. 1A and 1B show a double headed arrow indicating F for front side direction and B for the back side direction. Similarly, the front and back of a semiconductor substrate which is part of a die and/or device has a front and back at the same orientation, e.g. with the back being toward the top of the figure. Herein, a lateral direction can be perpendicular to the direction of front to back. For example, laterally adjacent objects can be adjacent along a direction which is perpendicular to the front-back direction. A lateral side may connect a front and back side. For example, a semiconductor can have a front side, a back side that is opposite to the front side, and a lateral side that connects the front and back sides. Herein, the cross-sections of dies and devices can be drawn with the front side direction being toward the bottom of the figure and the back side direction being toward the top.

Herein an example that "relates to" another example can mean that the first example (that relates to the second example) includes all the features of the first example.

FIG. 1A illustrates a semiconductor device. The semiconductor device 1001 of FIG. 1A can include a first semiconductor die 100 which includes a plurality 150 of transistors. The first semiconductor die 100 can be a processor die or memory die, for example. The device 1001 can also include a second semiconductor die 200 which can include power supply circuitry 240 configured to generate a supply voltage Vs for the plurality 150 of transistors of the first semiconductor die 100. Alternatively/additionally, the second semiconductor die 200 is a voltage regulator die that includes voltage regulator circuitry configured to generate a supply voltage for the plurality of transistors 150 of the (first) semiconductor die 100.

The second semiconductor die 200 can include a plurality of transistors at a front side of a semiconductor substrate of the second semiconductor die 200 (e.g. similar to the first semiconductor die 100 which, as in FIG. 1A, has a plurality of transistors 150 which can also be at a front side of a semiconductor substrate of the first die 100).

The device 1001 can include a heat spreader structure 300. A power supply routing 445 for a reference voltage or a power supply voltage V can extend from the heat spreader structure 300 through the second semiconductor die 200 to the first semiconductor die 100. The configuration can allow for more efficient use of space and/or reduction of ohmic losses. By providing power through the heat spreader and second semiconductor die to the first, it may be possible to reduce ohmic losses such as by shortening the conductive path to the transistors.

Herein, a plurality 150 of transistors can include at least one of a fin field-effect transistor, a nanowire transistor, a ribbon transistor, or a gate all around transistor.

The power supply routing 445 can have multiple parts. As shown in FIG. 1A, for example, the power supply routing 445 can have a part at the heat spreader structure 300, a second part at the second semiconductor die 200, and a third part at the first semiconductor die 100.

The power supply routing 445 can include at least one electrical connection at an interface of the first semiconductor die 100 and the second semiconductor die 200. The interface can be at a back side 110 of the first semiconductor die 110 and a front side of the second semiconductor die. The power supply routing 445 cam be electrically connected to at least one transistor of the plurality of transistors 150 of the first semiconductor die 100. The power supply routing 445 can provide ground voltage to the first semiconductor die 100, for example.

FIG. 1B illustrates a semiconductor device. The features described herein with respect to FIG. 1B may be included in the semiconductor device as described with respect to FIG. 1A, and vice versa. The device 101 of FIG. 1B has a first semiconductor die 100 which has a plurality of transistors 150 (e.g FinFETs), which may be at a front side 120 of a semiconductor substrate 160 of the first die 100 and/or at the front side of the die 100. A second semiconductor die 200 which includes power supply circuitry 240 may generate a supply voltage Vs for the plurality of transistors 150. The first and/or second semiconductor die 100, 200 can be embedded in a mold compound.

The device 101 may include a heat spreader structure 300, which may aid in removing heat from the first and/or second dies 100, 200. A power supply routing **445*a*, 445*b* for a reference voltage Vr or a power supply voltage may extend from the heat spreader structure 300 through the second semiconductor die 200 to the first semiconductor die 100. The heat spreader structure 300 and/or the first die 200 can attach to a circuit board 102 or the like. A front side 120 of the first semiconductor die 100 can connect to at least one of a package substrate or the circuit board 102**.

The power supply routing **445*a*, 445*b* can include a plurality of electrical connections 211, 212, 111, 112 at an interface 110, 210 of the first semiconductor die 100 and the second semiconductor die 200. The interface 110, 210 can be at a back side 110 of the first semiconductor die 100 and a front side 210 of the second semiconductor die 200. The power supply routing 445*a*, 445*b* can include multiple parts, such as a first part at the heat spreader structure 300, a second part at the second semiconductor die 200, and a third part at the first semiconductor die 100. Each part may be joined to an adjacent part by contact, e.g. by joining the respective metals of the parts. For example, the connections 211, 212, 111, 112 can be formed by at least one of hybrid bonding, copper-copper bonding, solderless Cu—Cu bonding, thermal compression bonding, or connections formed by bumps. In addition to the interface 110, 120, there can be a similarly formed interface at the interface of the heat spreader structure 300 and the second die 200**.

The first part can be formed by a part of a main body of the heat spreader structure 300 (e.g. a conductive main body thereof) or an electrically conductive trace arranged on or embedded in the heat spreader structure 300. The second part can be a through semiconductor via of the second semiconductor die 200. The third part can be a through semiconductor via of the first semiconductor die 100.

The power supply routing 4454 can include at least one through semiconductor via, such as one through the second semiconductor die 200. The through semiconductor via(s) can provide a reference voltage or a power supply voltage to the first semiconductor die 100.

The first die 100 which includes the transistors 150 can be a processor die, for example. A plurality of terminals 111, 112 may be present on the first die 100, e.g. for contacting a power supply. The terminals 111, 112 may be exposed for electrical coupling from a back side 110 of the processor die 100. When the second die 200 is attached to the first die 100, the electrical connections 211, 212, 111, 112 at the interface 110, 210 may be formed. The connections may allow multiple different voltages to be provided to the first die 100. The first 100 may be configured to operate on at least one supply voltage Vs and a reference voltage Vr. For example, the power supply circuitry 240 provides at least one supply voltage and optionally a reference voltage. A processor die and/or first die 100 can be configured to form electrical connections to the complementary power terminals from at least one external power supply exclusively at the back side of the die, e.g. by receiving power from the second die 200 which may be a voltage regulator.

The power supply routing **445*a*, 445*b* can includes at least one through semiconductor via through the second semiconductor die 200. The through semiconductor via(s) can provide the reference voltage Vr and/or a ground voltage to the first semiconductor die 100**.

Figure 2A:
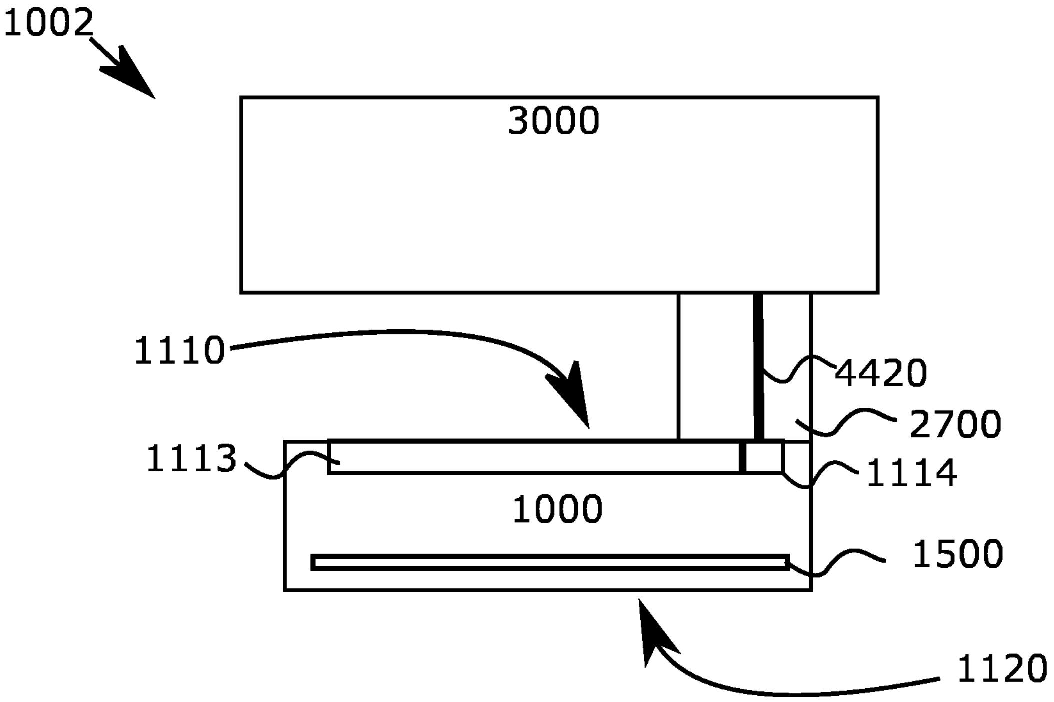
FIG. 2A illustrates a semiconductor device.

FIG. 2A illustrates a semiconductor device. The device 1002 can include the features described with respect to the other figures herein, and vice versa. The device 1002 includes a semiconductor die 1000 (e.g. a processor die or a memory die) comprising a plurality of transistors 1500 at a front 1120 side of the semiconductor die 1000. The device 1002 can include a power supply interface 1113 at the back side 1110 of the semiconductor die 1000. The device 1002 can include a heat spreader structure 3000 arranged at the back side 1110 of the semiconductor die 1000. The device 1002 can include a power supply interconnect structure 4420 extending from a power supply contact interface 1114 of the semiconductor die 1000 through a mold 2700 to the heat spreader structure 3000. The device 1002 can have reduced ohmic losses, for example. The power supply interface at the back side can allow shortened and/or widened electrical connections for reducing ohmic losses. Alternatively/additionally, the device can be made smaller, e.g. by having eth power supply interface at the back side of the semiconductor die 1000. The front side 1120 of the semiconductor die 1000 can connect to a package substrate or a circuit board.

The mold 2700 can extend from the back side of the semiconductor die 1000 to the heat spreader structure 3000. The head spreader structure 3000 can be electrically connected to a contact interface of a package substrate.

The semiconductor device can provide power to the transistors 1500 from the back side of the die 1000. It is possible to reduce ohmic loss and/or heating by reaching buried power rails or the like of the die 100, e.g. for powering the transistors, from the back side. Alternatively/ additionally, it can be possible to shrink the size of the device, e.g. by utilizing the back side of the die 1000 for providing power. Alternatively/additionally, the power supply interconnect structure 4420 can be made bigger than a typical through semiconductor via, for example, and this may reduce ohmic losses and/or heating as well.

The power supply interconnect structure 4420 may be a metal column (e.g. such as mainly copper and aluminum, and/or mainly copper) through the mold 2700, for example.

There may be a through mold via which extends from the heat spreader structure 3000 to the first semiconductor die 1000. For example, the power supply interconnect structure 4420 includes a through mold via. The through mold via can be laterally adjacent to a second semiconductor die (see for example FIG. 2B, e.g. the mold 280 which is laterally adjacent to the voltage regulator 270 which can be formed by a semiconductor die).

A voltage regulator and/or voltage regulator die (which may be adjacent the mold 2700) may include an electrical connection to the semiconductor die 1000 at the power supply interface 1113.

Figure 2B:
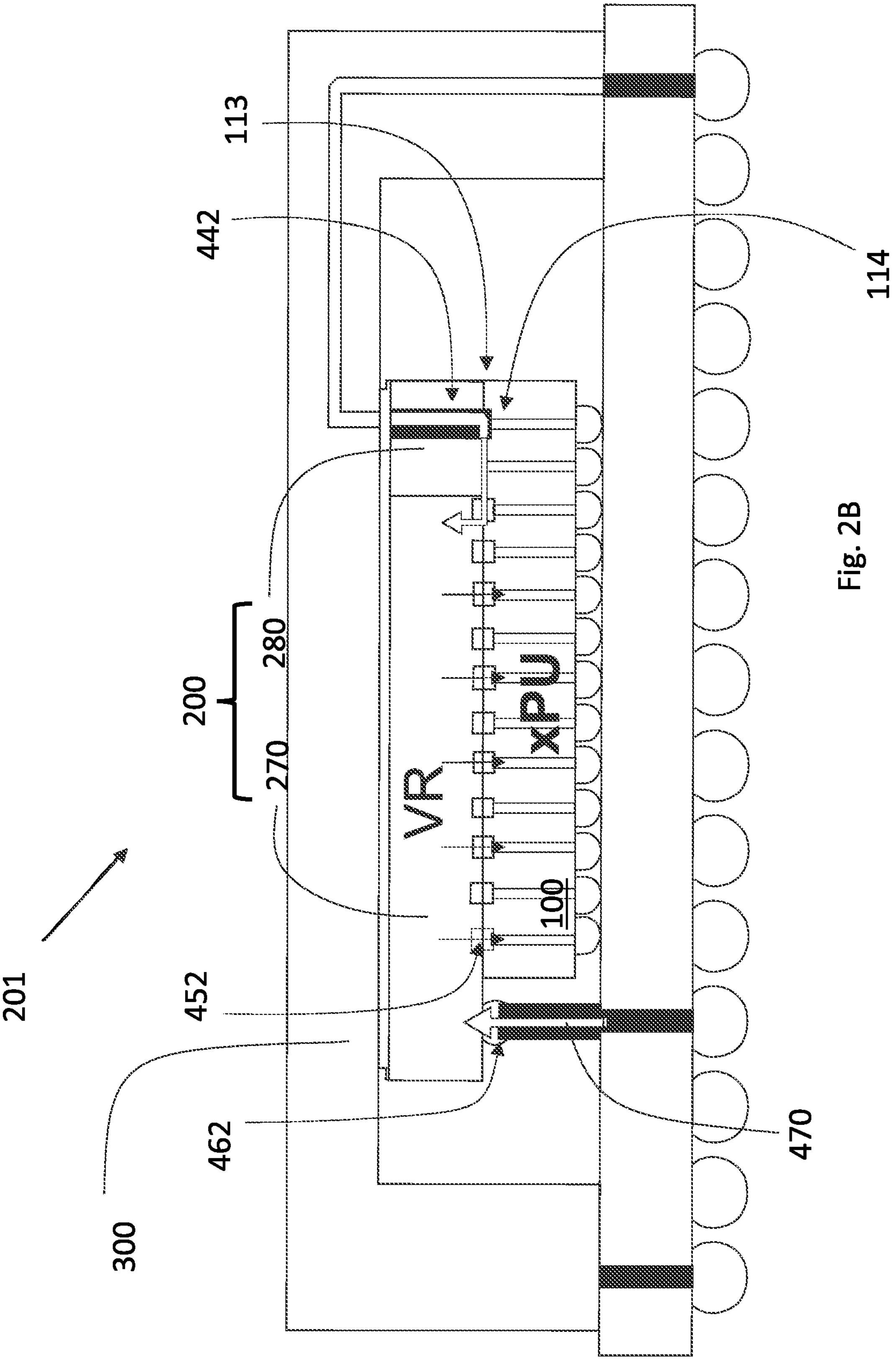
FIG. 2B illustrates a semiconductor device.

Alternatively/additionally, the power supply interconnect structure 4420 can extend along a lateral side of the semiconductor die. The lateral side of the semiconductor die connects the back side and a front side of the semiconductor diet FIG. 2B illustrates a semiconductor device 201. The device 201 can include the features described with respect to the other figures herein, and vice versa. The device 201 includes a semiconductor die 100 which includes a plurality of transistors 150 which can be at a front side 120 of the semiconductor die 100. A power supply interface 113 can be at the back side 110 of the semiconductor die 100. A heat spreader structure 300 can be arranged at a back side 110 of the semiconductor die 100. In FIG. 2B the heat spreader structure 300 is also at the back side of an optional module 200 that may include a voltage regulator 270 and/or a mold 280. The voltage regulator 270 may be alternatively/additionally a voltage regulator die 270, e.g. formed by a semiconductor die.

The mold 280 can be adjacent to side face of a voltage regulator die and/or voltage regulator 270, e.g. between the semiconductor die 100 and the heat spreader structure 300.

The heat spreader structure 300 may be adjacent the module 200 at the back side. A heat conductive adhesive material (e.g. a thermal interface material) may aid in joining structures such as dies and/or modules together, particularly the heat spreader structure 300 and at least part of the module 200.

A power supply interconnect structure 442 can extend from a power supply contact interface 114 of the semiconductor die 100 through a mold 280 to the heat spreader structure 300, as seen in FIG. 2B. The power supply interconnect structure 442 can possibly extend to a voltage regulator 270.

The mold 280 can extend from the back side 110 of the semiconductor die 100 to a front side of the heat spreader structure 300. The mold 280 can be adjacent a side face of a voltage regulator 270. The mold 208 and/or voltage regulator 270 can be between the semiconductor die 100 and the heat spreader structure 300. The die 100 of FIG. 2B can be a processor die. The power supply interconnect structure 442 can extend to the voltage regulator 270. The voltage regulator 270 can include an electrical connection 452 at a bottom face. The electrical connection 452 can electrically connect to the semiconductor die 100 at the power supply interface 113. The power supply interconnect structure 442 can, for example, provide a source voltage.

The power supply interconnect structure 442 can, for example, be part of a power supply routing which may extend to the voltage regulator 270 and/or voltage regulator die. The power supply routing can be electrically connected to a transistor of the plurality of transistors of the first semiconductor die 100. Alternatively/additionally, the power supply routing can provide ground voltage to the first semiconductor die.

As seen in FIG. 2B, there can be an electrical connection 462 at the bottom of the module 200 and/or voltage regulator 270 which is configured to connect to the circuit board 102. It is possible to have a power connection at the bottom the voltage regulator 270 and/or module 200 that comes from a conductive copper column or the like, as in the example of FIG. 2B.

Power, which may be the drain voltage for example, may be provided from below, e.g. from the circuit board and/or package substrate, e.g. at electrical connection 462. The power connection may be electrically connected to the package substrate and/or circuit board, e.g. by a conductive pillar 470, e.g. a conductive copper column or the like. A through mold via can extend from a package substrate and/or circuit board 402 to a second semiconductor die 200. The through mold via can be laterally adjacent to the first semiconductor die 100. For example, a conductive pillar 470 or the like may include the through mold via.

For example, the power supply interconnect structure 442 can include the electrical connection 462 and/or conductive pillar 470. The power supply interconnect structure 442 and/or conductive pillar 470 can extend along a lateral side of the semiconductor die 100, as seen in FIG. 2B. The lateral side of the semiconductor die 100 is a side that connects the back side and the front side of the semiconductor die. In FIG. 2B, the direction toward the front side is down and the direction toward the back side is up.

There may be a mold that extends along the lateral side of the semiconductor die. Such a lateral mold may be configured to electrically connect the power supply interconnect structure 442 to a substrate package or circuit board at a plane at the front side of the semiconductor die 100. Part of the power supply interconnect structure 442 may pass through the lateral mold, e.g. in the form of the conductive pillar 470 or the like.

As seen in FIG. 2B, a voltage regulator 270 and/or voltage regulator die may be between the semiconductor die 100 and the heat spreader structure 300. A voltage regulator die can include an electrical connection to electrically connect to the semiconductor die 100 at the power supply interface 113 (which may be along the interface at the back side of the semiconductor die 100, and may extend laterally beyond the lateral side of the semiconductor die 100, particularly the back side thereof). The lateral mold (or second mold) can extend from the front side of a voltage regulator die and/or voltage regulator 270 toward the front direction of the semiconductor die.

It is possible for there to be more than one mold. As shown in FIG. 2B, there may be a (first) mold 280 extending from the back side of the semiconductor die 100 to the heat spreader structure 300. There may be a second mold extending along the lateral side of the semiconductor die 100 (e.g. around and/or supporting the conductive pillar 470). The second mold can electrically connect the power supply interconnect structure 442 to a substrate package or circuit board at a plane at the front side of the semiconductor die 100 (e.g. by a conductive path, such as the conductive pillar 470, which is included in the mold). The power supply interconnect structure 442 can have multiple parts, e.g. a part that includes the conductive pillar 470, and another part that extends to the heat spreader structure 300. The first part of the power supply interconnect structure 442 can extend along a lateral side of the semiconductor die 100. For example the first part includes the conductive pillar 470 shown in FIG. 2B.

Figure 3A:
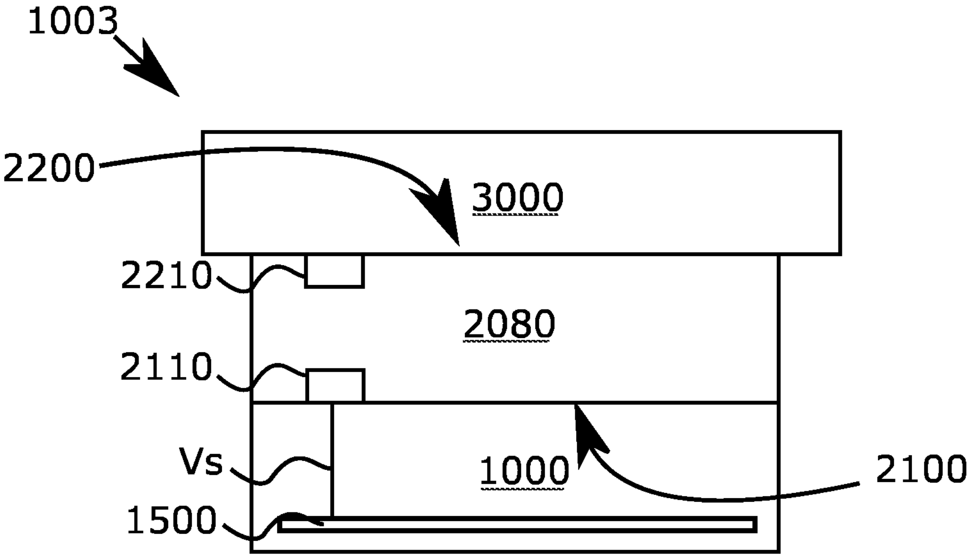
FIG. 3A illustrates a semiconductor device.

FIG. 3A illustrates a semiconductor device. The device 1003 can include a semiconductor die 1000 including a plurality of transistors 1500, and a voltage regulator die 2080 which can provide a supply voltage Vs for the plurality of transistors 1500 of the semiconductor die 1000. The device 1003 can include a heat spreader structure 3000 arranged at a back side 2200 of the voltage regulator die 2080. The voltage regulator die 2080 can include a first power supply contact interface 2110 at a front side 2100 of the voltage regulator die 2080 and a second power supply contact interface 2210 at a back side 2200 of the voltage regulator die. At least a part of the heat spreader structure 3000 can be electrically connected to the second power supply contact interface 2210. The semiconductor device 1003 can allow for more efficient use of space and/or reduce ohmic losses. It may be possible to reduce ohmic losses such as by shortening the conductive path to the transistors, for example. Alternatively/additionally, the arrangement of the heat spreader structure at the back side of the voltage regulator die may allow the footprint of the device to be reduced.

The transistors 1500 can be at the front side of the semiconductor die 1000. A power supply contact interface can be arranged at a backside of the semiconductor die.

The voltage regulator die 2080 can generate a first supply voltage and a second supply voltage. The first supply voltage and the second supply voltage can be provided to the semiconductor die 1000. The first supply voltage can be different from the second supply voltage.

The voltage regulator die can include a third power supply contact interface at a front side of the voltage regulator die for providing the second supply voltage to the semiconductor die The first power supply contact interface 2110 can be electrically connected to the semiconductor die 1000.

Figure 3B:
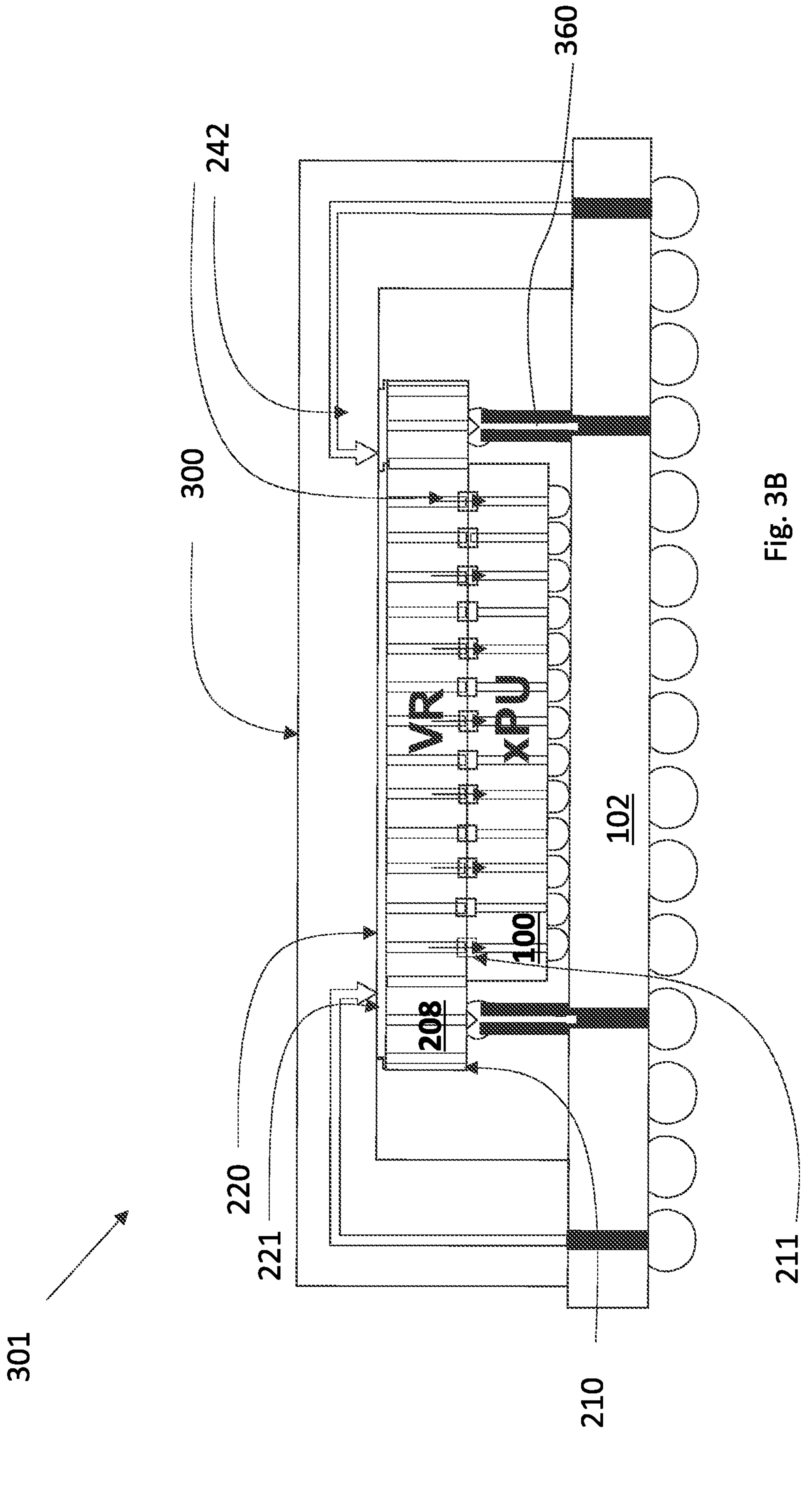
FIG. 3B illustrates a semiconductor device.

FIG. 3B illustrates a semiconductor device 301. The device 301 can include the features described with respect to the other figures herein, and vice versa. The device 301 includes a semiconductor die 100 which includes a plurality of transistors 150 (which can be at the front side of the die 100). The device 301 can include a voltage regulator die 208 which can include a voltage regulator as described herein.

The voltage regulator die 208 can provide a supply voltage Vs for the plurality of transistors 150 of the semiconductor die 100. The device 301 can include a heat spreader structure 300 arranged at a back side 220 of the voltage regulator die 208. The voltage regulator die 208 can include a first power supply contact interface 211 at a front side 210 of the voltage regulator die 208 and a second power supply contact interface 221 at a back side 220 of the voltage regulator die 208. At least a part of the heat spreader structure 300 can be electrically connected to the second power supply contact interface 221.

The voltage regulator die 208 can have multiple power supply contact interfaces. For example, the first power supply contact interface is at the front side and the second power supply contact interface is at the back side (e.g. for the ground voltage). A third power supply contact interface can be at the front side. The third may provide a second supply voltage to the semiconductor die.

The power supply contact interface(s), e.g. the first, second, and/or third, can be a contact pad (particularly the first power supply contact interface), or a backside metallization layer, which can be over at least 50% of the backside surface of the voltage regulator die 208 (particularly the second power supply contact interface).

The voltage regulator die an include a third power supply contact interface. The power supply interconnect structure can extend from the third power supply contact interface to the package substrate and/or circuit board. The power supply interconnect structure (e.g. conductive pillar 360) can be arranged laterally beside the semiconductor die 100.

The device 301 can include a package substrate and/or circuit board, and the semiconductor die 100 can be attached to the package substrate and/or circuit board.

The supply voltage and/or drain voltage can be routed from a circuit board (such as a printed circuit board) to the device 301. From there the power can be distributed within the device 301, which may be a multi die package, to each die of the device. For example, the power can be distributed to the back end of line (BEOL) metallization in the dies and/or buried power rails of the dies, particularly the die 100 which may be a processor die. It is possible, as shown herein, to use the back side of the package where usually heat is dissipated. Such arrangements as shown in FIG. 3B and elsewhere herein, can reduce package sizes and reduce resistances of connections. In some cases, the use of through semiconductor (silicon) vias (TSV) can be omitted. Avoiding using vias can reduce the IR (current*resistance) drop.

Herein, the back side of the devices and/or packages can be used for the power supply. In the presence of buried power rails, for example, the rails can be connected with micro through silicon vias (uTSV) which can land on the buried power rails from the back side. As the power is supplied from the back side, it is also shown herein the possibility of using the heat spreader for the power supply of a semiconductor die (including processor dies). The heat-spreader and/or heat spreader structure can provide power at the back side of a multi-die structure.

Coming from the back side for providing power can also reduce the length of through semiconductor vias and/or reduce the distance to the buried power rails. This can reduce resistance and/or allow better chip performance. Size of the device can be reduced.

As shown for example in FIG. 3B, for example, it is possible to use conductive pillars 360, such as copper columns or the like. For example, the drain voltage can be provided by a conductive pillar 360 to the back side of the die 100, and/or the interface of the voltage regulator and die 100. Buried power rails or the like in the die 100 can be connected by micro through semiconductor vias to the back side of the die and/or the interface of the voltage regulator and die 100.

The source voltage can be provided, for example by the heat spreader structure. The voltage regulator may, for example, pass the source voltage to the interface with for example through semiconductor vias. Providing the source voltage by the heat spreader structure can reduce the size of the device. There can be a reduction in the number of pillars by utilizing the heat spreader structure for at least some of the power circuitry.

Referring again to FIG. 2B, it is possible to avoid using through semiconductor in the voltage regulator 270. Power can be passed to the back side of the die 100 by the mold 280, for example. This can reduce size of the device, for example by still using back-side connect to the buried power rails or the like of the die 100 and maintaining low ohmic losses by avoiding the use of through semiconductor vias.

It is possible to have a semiconductor die that has a plurality of transistors (e.g. FinFETs) arranged at a front side of a semiconductor substrate, a plurality of power supply contact interfaces for electrically connecting the semiconductor die with at least one external power supply, and a plurality of power supply contact interfaces for electrically connecting the semiconductor die with an external power supply only at the back side of the semiconductor substrate. The plurality of power supply contact interfaces can be arranged at a back side of the semiconductor substrate. The plurality of transistors can be configured to receive power from the power supply contact interfaces.

Figure 4:
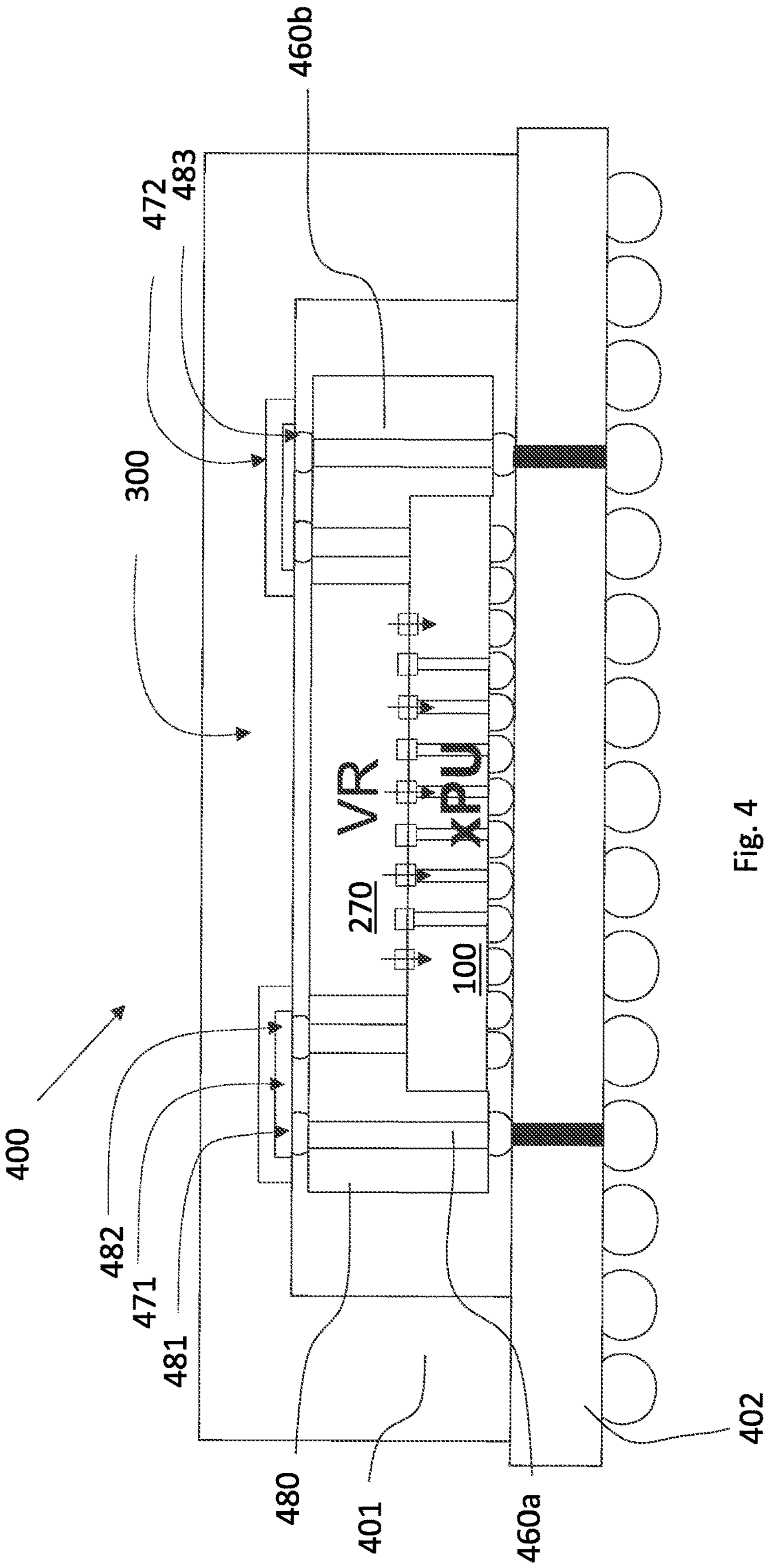
FIG. 4 illustrates a semiconductor device.

FIG. 4 illustrates a semiconductor device. The semiconductor device 301 of FIG. 4 can include the features described with respect to the other figures herein, and vice versa. The semiconductor device 301 of FIG. 4 includes a heat spreader 300. The heat spreader 300 of FIG. 4 is particularly described here, which is a form of heat spreader that may be combined with other devices described herein. The heat spreader 300 as seen in FIG. 4 can include an electrically conductive main body 401 and at least one electrically conductive trace 471, 472 which can be electrically insulated from the electrically conductive main body 401. The electrically conductive trace(s) can connect a first contact interface 481 of the heat spreader structure to another contact interface 482 of the heat spreader structure.

As seen in FIG. 4, the contact interfaces 481, 482 can each be at a first mold. There can be more contact interfaces at the same or another mold.

As seen in FIG. 4, a first conductive trace 471 allows for contact from a conductive pillar 460*a* from the circuit board 402 to a back side of the die 100. A second conductive trace 472 electrically contacts a second conductive pillar 460*b* from the circuit board 402 to the back side of the die 100, e.g. at a different region of the die back side. The heat spreader 300 may be able to support different voltages, e.g. a first voltage at the first conductive trace and a second voltage at the second conductive trace. For example, the first conductive trace 471 is insulated from the main body 401 of the heat spreader structure 300 and the second trace 472.

The heat spreader 300 of the device 400 may be able to support a plurality of voltages. The heat spreader 300 can have at least one trace.

Alternatively, a heat spreader 300 may have contact interfaces 481, 483 that make electrical contact to multiple external voltages and/or devices. The first contact interface 481 can make electrical contact to a first external voltage, and another contact interface 483 (e.g. a second contact interface) can make electrical contact with a second external voltage.

FIG. 4 shows electrically isolated traces as part of the heat spreader structure 300. The traces 471, 472 in the heat spreader structure can be connected with Cu columns from the bottom and used to redistribute drain and source voltages close to the voltage regulator, e.g. at the back side of the die 100. The interface between the voltage regulator 270 and the die 100 (e.g. processor die) can then be contacted from the top. Power, e.g. source and drain voltages can be routed at the interface, e.g. where the voltage regulator 270 and die 100 are put together by e.g. hybrid bonding.

Figure 5A:
FIG. 5A illustrates a metallization layer.

FIG. 5A illustrates a metallization layer. The metallization layer 500 can be at the interface of the die 100 and the module 200 and/or voltage regulator 270. For example, the metallization layer 500 is mainly at least one of copper or aluminum. The metallization layer may have a plurality of metallization domains 501, 502 to support multiple different voltages.

Figure 5B:
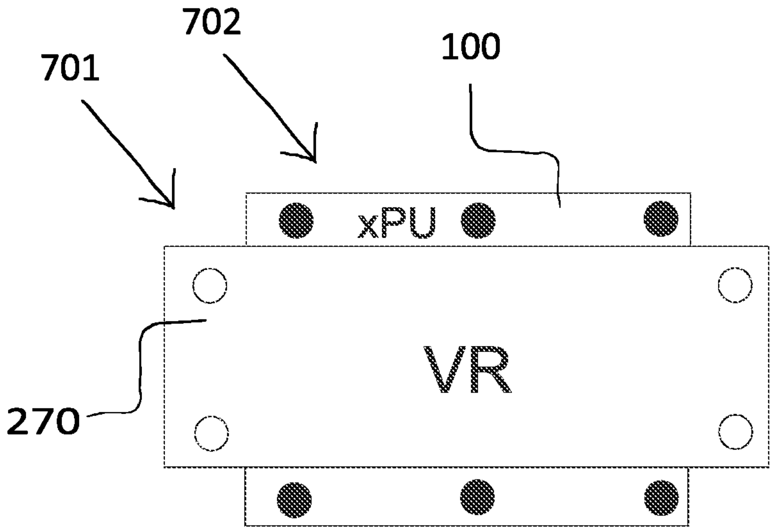
FIG. 5B illustrates a voltage regulator and die assembly.

FIG. 5B illustrates a schematic view of a voltage regulator and die assembly. FIG. 5B illustrates a top view to complement the cross sections shown elsewhere herein. The die 100 and voltage regulator 270 of FIG. 5B may represent that shown in the other figures herein, in cross-section. The voltage regulator 270 may have a length that is longer than the corresponding length of the die 100, e.g. to provide an overhanging region 701 which can be used for connecting to a conductive pillar from a circuit board (see for example the pillar 470 of FIG. 2 and connection 462). The regulator 270 may have a width that is narrower than a corresponding width of the die 100, e.g. to provide access to a region 702 of the top of the die which can be used to place a mold 280 or the like (see for example the mold 280 of FIG. 2).

Herein, it is possible to use a thermal interface material between any one or more of the die 100, the module 200, voltage regulator 270, heat spreader structure 300. It is possible to do so without short circuiting the power supply lines described herein. Such a material may help device performance.

Figure 6:
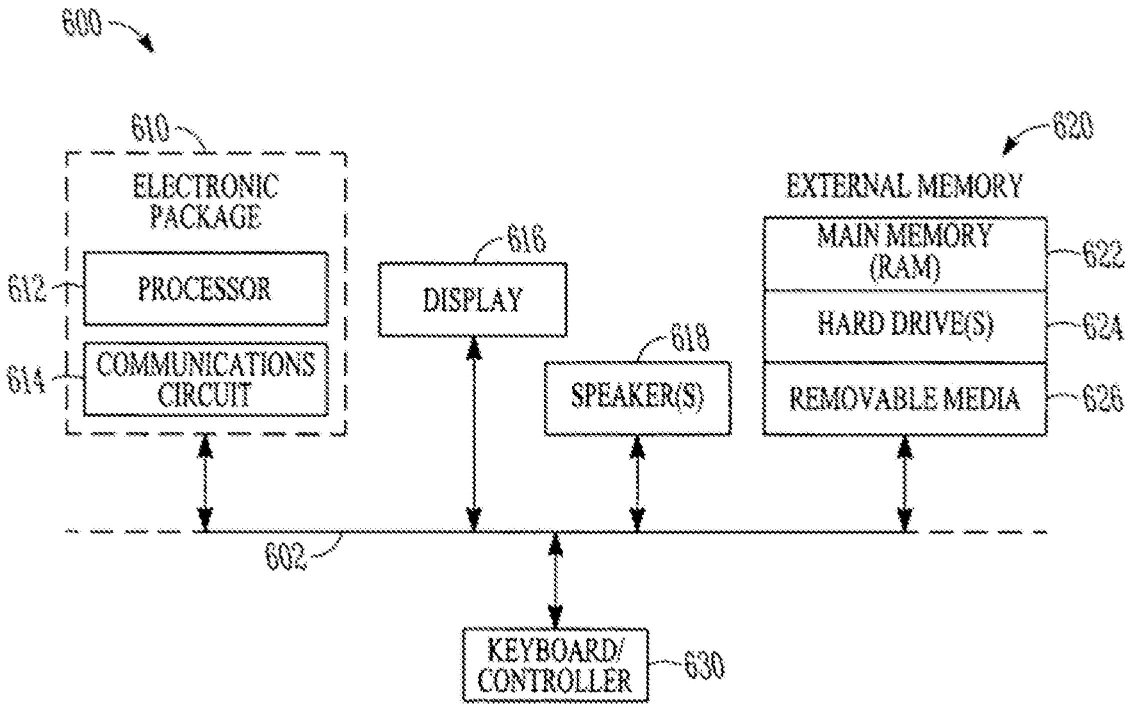
FIG. 6 is a block diagram of an electronic apparatus.

FIG. 6 is a block diagram of an electronic apparatus 600 incorporating at least one electronic device, die, and/or method described herein. Electronic apparatus 600 is merely one example of an electronic apparatus in which forms of the electronic assemblies, dies, and/or methods described herein may be used. Examples of an electronic apparatus 600 include, but are not limited to, personal computers, tablet computers, mobile telephones, game devices, MP3 or other digital music players, etc. In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic assembly 610 as describe herein may be coupled to system bus 602. The electronic assembly 610 may include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit. The electronic assembly may include any of the dies as described herein.

Other types of circuits that may be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch screen, voice-recognition device, or any other device that permits a system user to input information into and receive information from the electronic apparatus 600.

Figure 7:
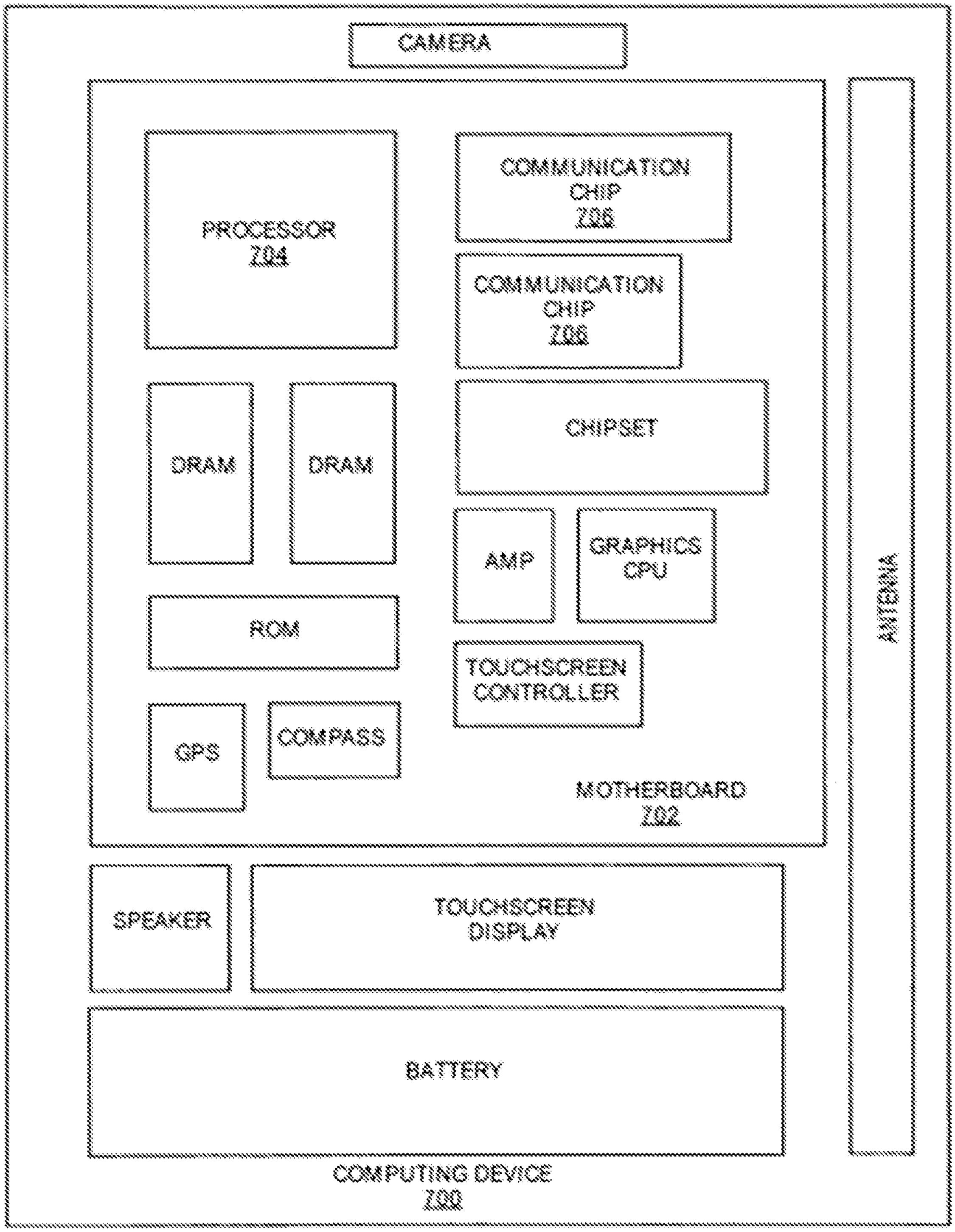
FIG. 7 is a block diagram of a computing device.

FIG. 7 illustrates a computing device 700. The computing device 700 can include a die as described herein. The computing device 700 can house a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704. The communication chip 706 and/or processor 704 can include a die as described herein.

Depending on its applications, computing device 700 may include other components that may or may not be physically and electrically coupled to the board 702. These other components include, but are not limited to, volatile memory (e.g., DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 can enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704, e.g. a die as described herein. In some implementations of the invention, the integrated circuit die of the processor includes one or more devices that are assembled in an ePLB or eWLB based POP package that that includes a mold layer directly contacting a substrate, in accordance with implementations of the invention. The term "processor" may refer to any device or portion of device that processes electronic data from registers and/or memory to transform that electronic data into other electronic data that may be stored in registers and/or memory. The communication chip 706 also includes an integrated circuit die packaged (e.g. a die as described herein) within the communication chip 706. In accordance with another implementation of the invention, the integrated circuit die of the communication chip includes one or more devices that are assembled in an ePLB or eWLB based POP package that that includes a mold layer directly contacting a substrate, in accordance with implementations of the invention.

Figure 8:
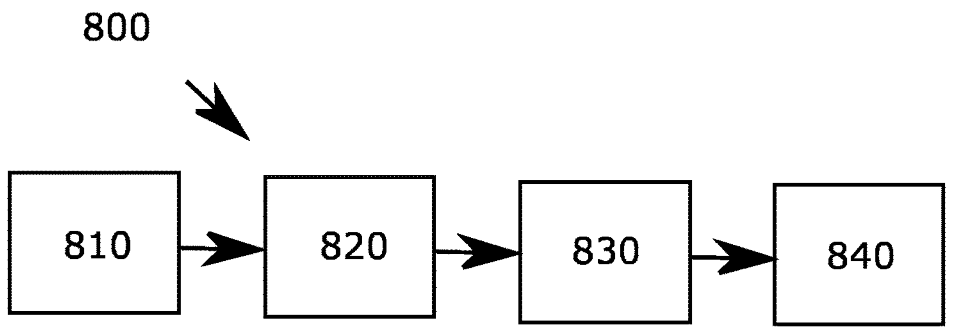
FIG. 8 illustrates a method of forming an electrical device.

FIG. 8 shows a method of forming an electronic device. A first semiconductor die is formed 810 which has a plurality of transistors. A second semiconductor die is formed 820 which includes power supply circuitry configured to generate a supply voltage for the plurality of transistors of the first semiconductor die. A heat spreader structure is formed 830. A power supply routing is formed 840 for a reference voltage or a power supply voltage, which extends from the heat spreader structure through the second semiconductor die to the first semiconductor die.

Figure 9:
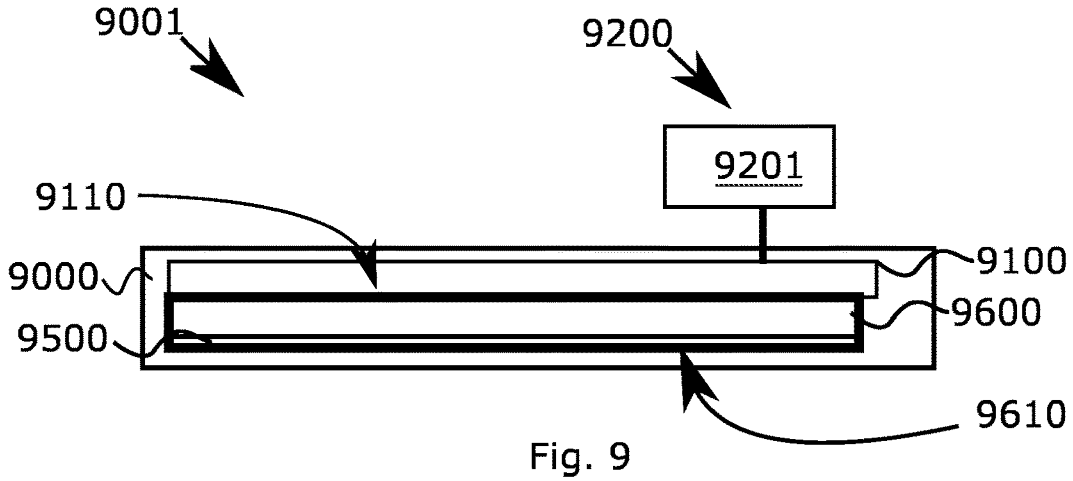
FIG. 9 illustrates a semiconductor die.

FIG. 9 illustrates a semiconductor die. The die 9001 can include a plurality of transistors 9500 arranged at a front side 9610 of a semiconductor substrate 9600, a plurality of power supply contact interfaces 9100 for electrically connecting the semiconductor die 9001 with at least one external power supply 9200. The plurality of power supply contact interfaces 9100 is arranged at a back side 9110 of the semiconductor substrate 9600 and/or die 9001. The semiconductor die 9001 comprises the power supply contact interfaces 9100 for electrically connecting the semiconductor die 9001 with an external power supply 9201 only at the back side 9110 of the semiconductor substrate 9600. The configuration of the die 9001 can allow for more efficient use of space and/or reduction of ohmic losses. By providing power only through the back side of the substrate 9600 and having the power supply contact interfaces 9100 at the back side 9110, it may be possible to reduce ohmic losses such as by shortening the conductive path to the transistors. Alternatively/additionally, it may be possible to reduce the size of the die 9001.

As shown in FIG. 9, the transistors 9500 can receive power from the power supply contact interface(s) 9100. There may be a plurality of data contact interfaces configured to receive or provide data signals. The plurality of data contact interfaces can be arranged at the front side 9610 of the semiconductor substrate 9600.

At least through semiconductor via may electrically connect the power supply contact interfaces to the transistors.

Figure 10:
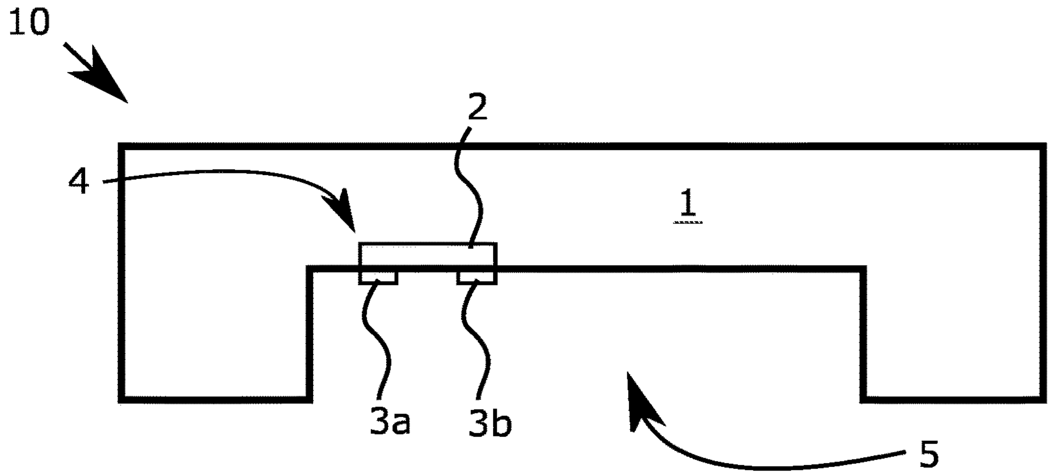
FIG. 10 illustrates a heat spreader structure.

FIG. 10 illustrates a heat spreader structure. The structure 10 can include an electrically conductive main body 1; and an electrically conductive trace 2 which can be electrically insulated from the electrically conductive main body 1. The electrically conductive trace 2 can connect a first contact interface 3*a* of the heat spreader structure 10 to a second contact interface 3*b* of the heat spreader structure 10. The heat spreader structure can aid in reducing the size of semiconductor devices and/or reducing ohmic losses (and possible reducing heating). Having at least two contact interfaces can allow voltages to delivered to other semiconductor dies and/or devices in a space-saving way and/or in a way to reduce possibly the overall path length of the circuit, e.g., to reduce ohmic losses.

Optionally, the electrically conductive trace 2 is arranged in a trench 4 extending into the electrically conductive main body 1. Alternatively/additionally, the electrically conductive main body 1 forms a cavity 5, and the first contact interface 3*a* and the second contact interface 3*b* are located at a surface inside the cavity 5.

The features of the heat spreader structure 10 described herein with regard to FIG. 10 can be combined with the heat spreaders and heat spreader structures elsewhere herein, particularly in regard to the other figures including FIGS. 1A, 1B, 2A, and 3A. For example, the heat spreader structures and/or heat spreaders described herein may also include a cavity.

The cavity 5 of the heat spreader structure (as seen in FIG. 10 for example) can allow for convenient placement/arrangement of the other components, e.g. the first 100 and/or second 200 semiconductor dies, for example. A cavity 5 can aid in efficiently using space and may, alternatively/additionally, allow for electrical connection with additional components such as a package substrate and/or circuit board. A heat spreader structure 10 can be electrically connected to a contact interface of a package substrate and/or circuit board. For example, this may allow a voltage to be provided from the package substrate and/or circuit board to the first die 100 (e.g. by a conductive path which may include a path through other components such as a second die 200).

Herein, the vias may be through semiconductor vias and/or through silicon vias. The vias may be microscale, for example, having diameters of about 5-150 μm, such as 15-75 μm.

Herein, a semiconductor substrate can be made of materials including, for example, n-type or p-type materials systems (or a combination of both). The substrate may include, for example, a crystalline substrate formed using a bulk silicon or a silicon-on-insulator (SOI) substructure. In some embodiments, the substrate may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate.

Herein, the transistors may be metal oxide semiconductor field-effect transistors (MOSFETs) and/or FinFETs, e.g. formed using a semiconductor substrate. The is much interest in reducing the size of semiconductor dies/devices, particularly those that utilize FinFETs. The examples herein are however not necessarily limited to semiconductor dies that include FinFETs. A wide variety of other types and configurations such as, for example, planar transistors, non-planar transistors, or a combination of both can be used in combination with the inductor(s) described herein. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. The transistors depicted herein may include additional specific features thereof not depicted or not described for the sake of clarity/brevity, such as device isolation regions, gate contacts, and the like.

A semiconductor device described herein may be a semiconductor package comprising a semiconductor die (such as a die as described herein). The semiconductor device may be a processor (e.g. CPU, GPU or DSP), a memory or any other integrated circuit. The semiconductor die may be a processor die (e.g. CPU, GPU or DSP), a memory die, or any other integrated circuit die.

The following enumerated examples are hereby described, which may aid understanding and provide easy reference between examples.

An example (example 1) relates to a semiconductor device comprising: a first semiconductor die comprising a plurality of transistors; a second semiconductor die comprising power supply circuitry configured to generate a supply voltage for the plurality of transistors of the first semiconductor die; and a heat spreader structure. A power supply routing for a reference voltage or a power supply voltage extends from the heat spreader structure through the second semiconductor die to the first semiconductor die.

Another example (e.g. example 2) relates to a previously described example (e.g. the semiconductor device of example 1), wherein the power supply routing includes a plurality of electrical connections at an interface of the first semiconductor die and the second semiconductor die. The interface is at a back side of the first semiconductor die and a front side of the second semiconductor die.

Another example (e.g. example 3) relates to a previously described example (e.g. example 1 or 2), wherein a front side of the first semiconductor die is configured to connect to a package substrate or a circuit board.

Another example (e.g. example 4) relates to a previously described example (e.g. example 1, 2, or 3), wherein the power supply routing comprises a first part at the heat spreader structure, a second part at the second semiconductor die, and a third part at the first semiconductor die.

Another example (e.g. example 5) relates to a previously described example (e.g. example 4), wherein the first part is formed by a part of a main body of the heat spreader structure or an electrically conductive trace arranged on or embedded in the heat spreader structure; the second part is a through semiconductor via of the second semiconductor die; and the third part is a through semiconductor via of the first semiconductor die.

Another example (e.g. example 6) relates to a previously described example (e.g. any one of examples 1-5) wherein the power supply routing includes at least one through semiconductor via through the second semiconductor die, the at least one through semiconductor via for providing the reference voltage or a power supply voltage to the first semiconductor die.

Another example (e.g. example 7) relates to a previously described example (e.g. any one of examples 1-6), wherein the heat spreader structure forms a cavity, and the first semiconductor die and the second semiconductor die are arranged in the cavity.

Another example (e.g. example 8.1) relates to a previously described example (e.g. any one of examples 1-7), wherein the heat spreader structure is electrically connected to a contact interface of a package substrate.

Another example (e.g. example 8.2) relates to a previously described example (e.g. any one of examples 1-7, and 8.1), wherein at least one of the first semiconductor die or the second semiconductor die are embedded in mold compound.

Another example (e.g. example 8.3) relates to a previously described example (e.g. any one of examples 1-7 and 8.1-8.2), further comprising a through mold via extending from the heat spreader structure to the first semiconductor die. The through mold via can be laterally adjacent to the second semiconductor die.

Another example (e.g. example 8.4) relates to a previously described example (e.g. any one of examples 1-7 and 8.1-8.3), further comprising a through mold via extending from a package substrate to the second semiconductor die. The through mold via can be laterally adjacent to the first semiconductor die.

Another example (e.g. example 8.5) relates to a previously described example (e.g. any one of examples 1-7 and 8.1-8.4), wherein the power supply routing is electrically connected to a transistor of the plurality of transistors of the first semiconductor die.

Another example (e.g. example 8.6) relates to a previously described example (e.g. any one of examples 1-7 and 8.1-8.5), wherein the power supply routing is configured to provide ground voltage to the first semiconductor die.

Another example (e.g. example 8.7) relates to a previously described example (e.g. any one of examples 1-7 and 8.1-8.6), wherein the first semiconductor die is a processor die or a memory die.

Another example (e.g. example 8.8) relates to a previously described example (e.g. any one of examples 1-7 and 8.1-8.7), wherein the second semiconductor die is a voltage regulator die comprising voltage regulator circuitry configured to generate a supply voltage for the plurality of transistors of the semiconductor die.

Another example (e.g. example 8.9) relates to a previously described example (e.g. any one of examples 1-7 and 8.1-8.8), wherein the second semiconductor die comprises a plurality of transistors at a front side of a semiconductor substrate of the second semiconductor die.

Another example (e.g. example 9) relates to a semiconductor device comprising: a semiconductor die comprising a plurality of transistors at a front side of the semiconductor die and a power supply interface at the back side of the semiconductor die; a heat spreader structure arranged at a back side of the semiconductor die; and a power supply interconnect structure extending from a power supply contact interface of the semiconductor die through a mold. The power supply interconnect structure can extend to the heat spreader structure. Alternatively/additionally, the power supply interconnect structure of example 9 can extend along a lateral side of the semiconductor die. The lateral side of the semiconductor die can connect the back side and a front side of the semiconductor die. Example 9 may include either or both of a first and second mold; the first having a first part of the power supply interconnect structure which extends from a power supply contact interface of the semiconductor die, and the second having a second part of the power supply interconnect structure which extends along a lateral side of the semiconductor die Another example (e.g. example 10) relates to a previously described example (e.g. example 9), wherein the (e.g. first) mold extends from the back side of the semiconductor die to the heat spreader structure.

Another example, (e.g. example 11) relates to a previously described example (e.g. example 9 or 10), wherein the (e.g. first) mold is adjacent a side face of a voltage regulator die between the semiconductor die and the heat spreader structure.

Another example, (e.g. example 12.1) relates to a previously described example (e.g. example 9, 10, or 11), wherein a power supply routing which includes the power supply interconnect structure extends to the voltage regulator die. The power supply routing can be electrically connected to a transistor of the plurality of transistors of the first semiconductor die. Alternatively/additionally, the power supply routing can provide ground voltage to the first semiconductor die.

Another example, (e.g. example 12.2) relates to a previously described example (e.g. any one of examples 9-11 and 12.1), wherein the voltage regulator die includes an electrical connection which is electrically connected to the semiconductor die at the power supply interface.

Another example, (e.g. example 13.1) relates to a previously described example (e.g. any one of examples 9-11 and 12.1 and 12.2), wherein the (e.g. second) mold extends along the lateral side of the semiconductor die and is configured to electrically connect the power supply interconnect structure to a substrate package or circuit board at a plane at the front side of the semiconductor die.

Another example, (e.g. example 13.2) relates to a previously described example (e.g. any one of examples 9-11, 12.1-12.2, and 13.1), further comprising: a voltage regulator die between the semiconductor die and the heat spreader structure, wherein the voltage regulator die includes an electrical connection which is electrically connected to the semiconductor die at the power supply interface; wherein the (e.g. second) mold extends from the front side of the voltage regulator die toward the front direction of the semiconductor die.

Another example (e.g. example 13.3) relates to a previously described example (e.g. any one of examples 9-11, 12.1, 12.2, 13.1, and 13.2), further comprising: a first mold extending from the back side of the semiconductor die to the heat spreader structure, and a second mold extending along the lateral side of the semiconductor die. The second mold can electrically connect the power supply interconnect structure to a substrate package or circuit board at a plane at the front side of the semiconductor die. The power supply interconnect structure can extend to the heat spreader structure, and the power supply interconnect structure can extend along a lateral side of the semiconductor die. The lateral side of the semiconductor die connects the back side and a front side of the semiconductor die.

Another example, (e.g. example 14.1) relates to a previously described example (e.g. any one of examples 9-11, 12.1, 12.2, and 13.1-13.3), wherein a front side of the semiconductor die is configured to connect to package substrate or a circuit board.

Another example, (e.g. example 14.2) relates to a previously described example (e.g. any one of examples 9-11, 12.1, 12.2, 13.1-13.3, and 14.1), wherein the heat spreader structure forms a cavity, and the semiconductor die is in the cavity.

Another example (e.g. example 14.3) relates to a previously described example (e.g. any one of examples 9-11, 12.1, 12.2, 13.1-13.3, and 14.1-14.2), wherein the heat spreader structure is electrically connected to a contact interface of a package substrate.

Another example (e.g. example 14.4) relates to a previously described example (e.g. any one of examples 9-11, 12.1, 12.2, 13.1-13.3, and 14.1-14.3), wherein the semiconductor die is a processor die or a memory die.

Another example (e.g. example 15) relates to a semiconductor device comprising: a semiconductor die comprising a plurality of transistors; a voltage regulator die configured to provide a supply voltage for the plurality of transistors of the semiconductor die; and a heat spreader structure arranged at a back side of the voltage regulator die; wherein the voltage regulator die includes a first power supply contact interface at a front side of the voltage regulator die and a second power supply contact interface at a back side of the voltage regulator die; wherein at least a part of the heat spreader structure is electrically connected to the second power supply contact interface.

Another example (e.g. example 16) relates to a previously described example (e.g. example 15), wherein the transistors are at the front side of the semiconductor die and a power supply contact interface is arranged at a backside of the semiconductor die.

Another example (e.g. example 17.1) relates to a previously described example (e.g. one of examples 15 and 16), wherein the first power supply contact interface is electrically connected to the semiconductor die.

Another example (e.g. example 17.2) relates to a previously described example (e.g. one of examples 15, 16, and 17.1), wherein the voltage regulator die is configured to generate a first supply voltage and a second supply voltage and provide the first supply voltage and the second supply voltage to the semiconductor die, wherein the first supply voltage differs from the second supply voltage.

Another example (e.g. example 17.3) relates to a previously described example (e.g. one of examples 15, 16, 17.1, and 17.2), wherein the voltage regulator die comprises a third power supply contact interface at a front side of the voltage regulator die for providing the second supply voltage to the semiconductor die.

Another example (e.g. example 17.4) relates to a previously described example (e.g. any one of examples 15, 16, and 17.1-17.3), wherein the voltage regulator die is configured to receive a ground voltage through the second power supply contact interface.

Another example (e.g. example 17.5) relates to a previously described example (e.g. any one of examples 15, 16, and 17.1-17.4), wherein the second power supply contact interface is a contact pad or is a backside metallization layer extend over at least 50% of a backside surface of the voltage regulator die.

Another example (e.g. example 17.6) relates to a previously described example (e.g. any one of examples 15, 16, and 17.1-17.5), wherein the first power supply contact interface is a contact pad.

Another example (e.g. example 17.7) relates to a previously described example (e.g. any one of examples 15, 16, and 17.1-17.6), further comprising a package substrate, wherein the semiconductor die is attached to the package substrate.

Another example (e.g. example 17.8) relates to a previously described example (e.g. any one of examples 15, 16, and 17.1-17.7), wherein the voltage regulator die comprises a third power supply contact interface, wherein a power supply interconnect structure extends from the third power supply contact interface to the package substrate, wherein the power supply interconnect structure is arranged laterally beside the semiconductor die.

Another example (e.g. example 18) relates to a semiconductor die comprising: a plurality of transistors arranged at a front side of a semiconductor substrate, a plurality of power supply contact interfaces for electrically connecting the semiconductor die with at least one external power supply. The plurality of power supply contact interfaces is arranged at a backside of the semiconductor substrate. The semiconductor die comprises power supply contact interfaces for electrically connecting the semiconductor die with an external power supply only at the backside of the semiconductor substrate.

Another example (e.g. example 19) relates to a previously described example (e.g. example 18), wherein the plurality of transistors is configured to receive power from the power supply contact interfaces.

Another example (e.g. example 20) relates to a previously described example (e.g. example 18 or 19), further comprising a plurality of data contact interfaces configured to receive or provide data signals, wherein the plurality of data contact interfaces are arranged at the front side of the semiconductor substrate.

Another example (e.g. example 21) relates to a previously described example (e.g. example 18 or 19 or 20), further comprising a plurality of through semiconductor vias electrically connecting the plurality of power supply contact interfaces to the plurality of transistors.

Another example (e.g. example 22) relates to a heat spreader structure, comprising an electrically conductive main body; and an electrically conductive trace which is optionally electrically insulated from the electrically conductive main body. The electrically conductive trace connects a first contact interface of the heat spreader structure to a second contact interface of the heat spreader structure.

Another example (e.g. example 23) relates to a previously described example (e.g. example 22) wherein the electrically conductive trace is arranged in a trench extending into the electrically conductive main body.

Another example (e.g. example 24) relates to a previously described example (e.g. example 22 or 23) wherein the electrically conductive main body forms a cavity. The first contact interface and the second contact interface can be located at a surface inside the cavity.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended.

Furthermore, features of a claim should also be included for any other independent claim, even if that claim is not directly defined as dependent on that other independent claim.

What is claimed is:

1. A semiconductor device comprising:

a first semiconductor die comprising a plurality of transistors, wherein the first semiconductor die is arranged over a package substrate or a circuit board;

a second semiconductor die comprising power supply circuitry configured to generate a supply voltage for the plurality of transistors of the first semiconductor die; and a heat spreader structure arranged over the second semiconductor die, wherein a first power supply routing for a reference voltage or a power supply voltage extends from the heat spreader structure to the first semiconductor die and the second semiconductor die, and a second power supply routing for a reference voltage or a power supply voltage extends from the package substrate or the circuit board to the second semiconductor die through a path that is physically separate from the heat spreader structure.

2. The semiconductor device of claim 1, wherein the first power supply routing for the reference voltage or the power supply voltage includes a plurality of electrical connections at an interface of the first semiconductor die and the second semiconductor die;

wherein the interface is at a back side of the first semiconductor die and a front side of the second semiconductor die.

3. The semiconductor device of claim 1, wherein a front side of the first semiconductor die is configured to connect to the package substrate or the circuit board.

4. The semiconductor device of claim 1, wherein the first power supply routing for the reference voltage or the power supply voltage comprises a first part at the heat spreader structure, a second part at the second semiconductor die, and a third part at the first semiconductor die.

5. The semiconductor device of claim 4, wherein the first part is formed by a part of a main body of the heat spreader structure or an electrically conductive trace arranged on or embedded in the heat spreader structure;

wherein the second part is a through semiconductor via of the second semiconductor die; and wherein the third part is a through semiconductor via of the first semiconductor die.

6. The semiconductor device of claim 1, wherein the first power supply routing for the reference voltage or the power supply voltage includes at least one through semiconductor via through the second semiconductor die for providing the reference voltage or the power supply voltage to the first semiconductor die.

7. The semiconductor device of claim 1, wherein the heat spreader structure forms a cavity, wherein the first semiconductor die and the second semiconductor die are arranged in the cavity.

8. The semiconductor device of claim 1, further comprising:

a through mold via extending from the heat spreader structure to the first semiconductor die, wherein the heat spreader structure is electrically connected to a contact interface of the package substrate or the circuit board.

* * * * *